(12) United States Patent
Nemoto et al.

(10) Patent No.: US 6,967,480 B2
(45) Date of Patent: Nov. 22, 2005

(54) SUPERCONDUCTING MAGNET FOR MRI

(75) Inventors: Takeo Nemoto, Chiyoda (JP); Hiroyuki Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/855,373

(22) Filed: May 28, 2004

(65) Prior Publication Data
US 2005/0077898 A1 Apr. 14, 2005

(30) Foreign Application Priority Data
Oct. 10, 2003 (JP) .............................. 2003-352422

(51) Int. Cl.[7] .............................................. G01V 3/00
(52) U.S. Cl. ...................................... 324/318; 324/322
(58) Field of Search ................................ 324/318, 319, 324/322, 309, 307, 300; 335/299, 396; 505/892; 62/51.2

(56) References Cited
U.S. PATENT DOCUMENTS
6,172,588 B1 * 1/2001 Laskaris et al. ........... 335/299
6,396,376 B1   5/2002 Laskaris
6,819,107 B2 * 11/2004 Heid ........................ 324/318

FOREIGN PATENT DOCUMENTS
| JP | 11-176629 | 7/1999 |
| JP | 2001-244109 | 9/2001 |
| JP | 2002-270913 | 9/2002 |

* cited by examiner

Primary Examiner—Brij B. Shrivastav
(74) Attorney, Agent, or Firm—Antonelli, Terry, Stout and Kraus, LLP.

(57) ABSTRACT

The invention utilizes a characteristic of superconducting coils that they have high thermal conductivity in a direction of winding. A part of the superconducting coils is thermally connected with liquid helium through thermal anchors so that the part of the superconducting coils can be cooled to the liquid helium temperature. This cooling structure maintains thermal stability of a superconducting MRI magnet even in a condition that a refrigerator stops for a certain period of time, and reduces a manufacturing cost of the superconducting magnet.

11 Claims, 7 Drawing Sheets

SUPERCONDUCTING MAGNET FOR MRI

BACKGROUND OF THE INVENTION

The present invention relates to a superconducting magnet for MRI and more particularly to a cooling structure therefor.

A superconducting magnet for MRI (Magnetic Resonance Imaging) is designed to produce a uniform magnetic field in a space defined between upper and lower doughnut-shaped, superconducting coils. In a hospital a patient is laid between the upper and lower superconducting coils to examine his or her internal organs and the like. Conventionally, a horizontal cylindrical superconducting coil has been used as a superconducting MRI magnet but there is a problem that a patient feels being cooped up. An MRI system using two superconducting coils, situated at upper and lower positions, is called an "open type" because a space opening in a horizontal direction is formed by the upper and lower superconducting coils. This "open type" MRI system is well received by doctors and patients since it gives little intimidatory feeling and oppressive feeling. This invention concerns the superconducting magnets for this "open type" MRI system.

As concerns a cooling construction for a superconducting magnet, JP-A-2001-244109 discloses a structure which is connected to a refrigerator through a heat transporting medium and removes heat from coils by operating the refrigerator. JP-A-11-176629 discloses a superconducting magnet device in which frames for superconducting coils are made of an aluminum alloy and a refrigerator is installed on the frames through a heat conducting member.

Further, JP-A-2002-270913 discloses a technique that uses a sensible heat of evaporated helium gas to cool a thermal shield in order to reduce a consumption of liquid helium while a refrigerator is stopped.

The superconducting magnets for MRI are used in hospitals mainly for clinical purposes. It is therefore required that the superconducting magnet should be quenched for a predetermined period of time even when the refrigerator is stopped. Conventional superconducting MRI magnets have a problem that, while the refrigerator is stopped, the superconducting magnet is quenched, and an MRI imaging device fails to perform its function and becomes unavailable.

BRIEF SUMMARY OF THE INVENTION

The present invention has an object of reducing a manufacturing cost of a superconducting MRI magnet by simplifying a cooling structure and of providing the superconducting MRI magnet that will not be quenched even when a mounted refrigerator is stopped for a certain period of time.

When the refrigerator stops, liquid helium in a liquid receiver of a superconducting MRI magnet receives radiated heat and conducted heat and thus evaporates. The liquid helium is consumed through the evaporation, and a level of the liquid helium in the liquid receiver lowers. To ensure that superconducting coils operate stably even when the helium liquid level becomes low, a member of high heat conductivity is provided on the outer periphery of the superconducting coils. A heat conductive member or thermal anchor immersed in the liquid helium is mounted only on a part of the highly heat-conductive member or the superconducting coils.

More specifically, a superconducting magnet for MRI according to the invention comprises a doughnut-shaped upper superconducting coil, a doughnut-shaped lower superconducting coil, a liquid receiver storing liquid helium, a thermal shield accommodating the upper superconducting coil, the lower superconducting coil and the liquid receiver, a vacuum container accommodating the thermal shield, and a refrigerator for cooling the liquid receiver and the thermal shield, wherein a magnetic field in a vertical direction is generated in a space between the upper superconducting coil and the lower superconducting coil. In this superconducting MRI magnet, the upper superconducting coil and the lower superconducting coil are wound on respective coil frames through coil conduction members formed of a highly heat-conductive material, and a thermal anchor of a highly heat-conductive material thermally connected to the coil conduction member of at least the upper superconducting coil is provided in the liquid receiver. The superconducting coils are supported and fixed apart from the vacuum container by load supports. The coil conduction members may be formed into a shape such that they can be accommodated in the coil frames and held in contact with their coil winding surfaces. The coil frames of the superconducting coils may be formed of a highly heat-conductive material comprising copper alloy or aluminum alloy. The coil conduction members are divided in two or more in their circumferential directions. The liquid receiver is provided on a circumferentially partial area of the upper superconducting coil and the lower superconducting coil.

A highly heat-conductive planar member made of a highly heat-conductive material may be installed on a part of at least the upper superconducting coil, and the thermal anchor may be thermally connected with the highly heat-conductive planar member. A part of a wall forming the liquid receiver may be formed of a plate of a highly heat-conductive material, and the thermal anchor may be thermally connected with the highly heat-conductive planar member through the plate. The liquid receiver may be formed of a highly heat-conductive material, and a heat exchanger connected to the refrigerator and the highly heat-conductive planar member or the thermal anchor may be thermally connected with the liquid receiver.

The coil frames of the superconducting coils may form a part of the wall of the liquid receiver. The upper superconducting coil and the lower superconducting coil may be installed in a helium tank communicating with the liquid receiver.

In this specification, the term "high thermal conductivity (highly heat-conductive)" refers to thermal conductivity of 200 W/mK or higher at room temperature. A typical material satisfying this requirement is aluminum and copper.

Thermally connecting the thermal anchors between the superconducting coils and liquid helium can stably cool the superconducting coils even when the level of liquid helium in the liquid receiver is low. This in turn enables the liquid receiver to be reduced in volume, resulting in a reduction in the material cost and transport cost. Further, by replacing the liquid tank with that of high thermal conductivity, the thermal anchors and the heat exchanger can be shortened in length, resulting in a cost reduction. Further, by providing a construction of cooling the superconducting coils through the thermal anchors, it is possible to build a cooling system that prevents the superconducting magnet from being quenched for a predetermined period even when the refrigerator stops.

Other objects, features and advantages of the invention will become apparent from the following description of the embodiments of the invention taken in conjunction with the accompanying drawings.

DETAILED DESCRIPTION OF THE INVENTION

Now, embodiments of the invention will be described with reference to accompanying drawings.

Figure 1:
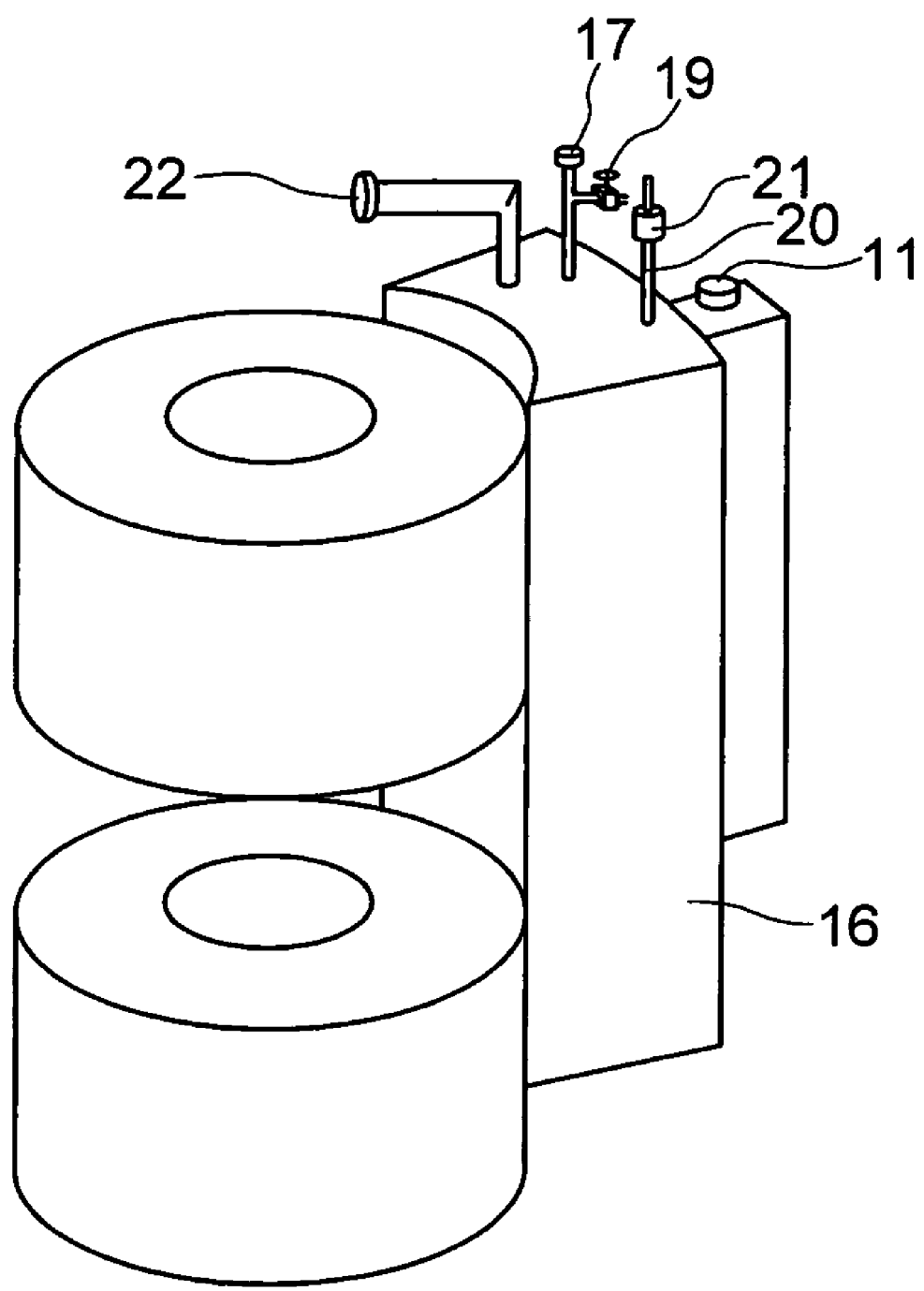
FIG. 1 is an outline view of a conduction cooling type superconducting MRI magnet according to the invention.
Figure 2:
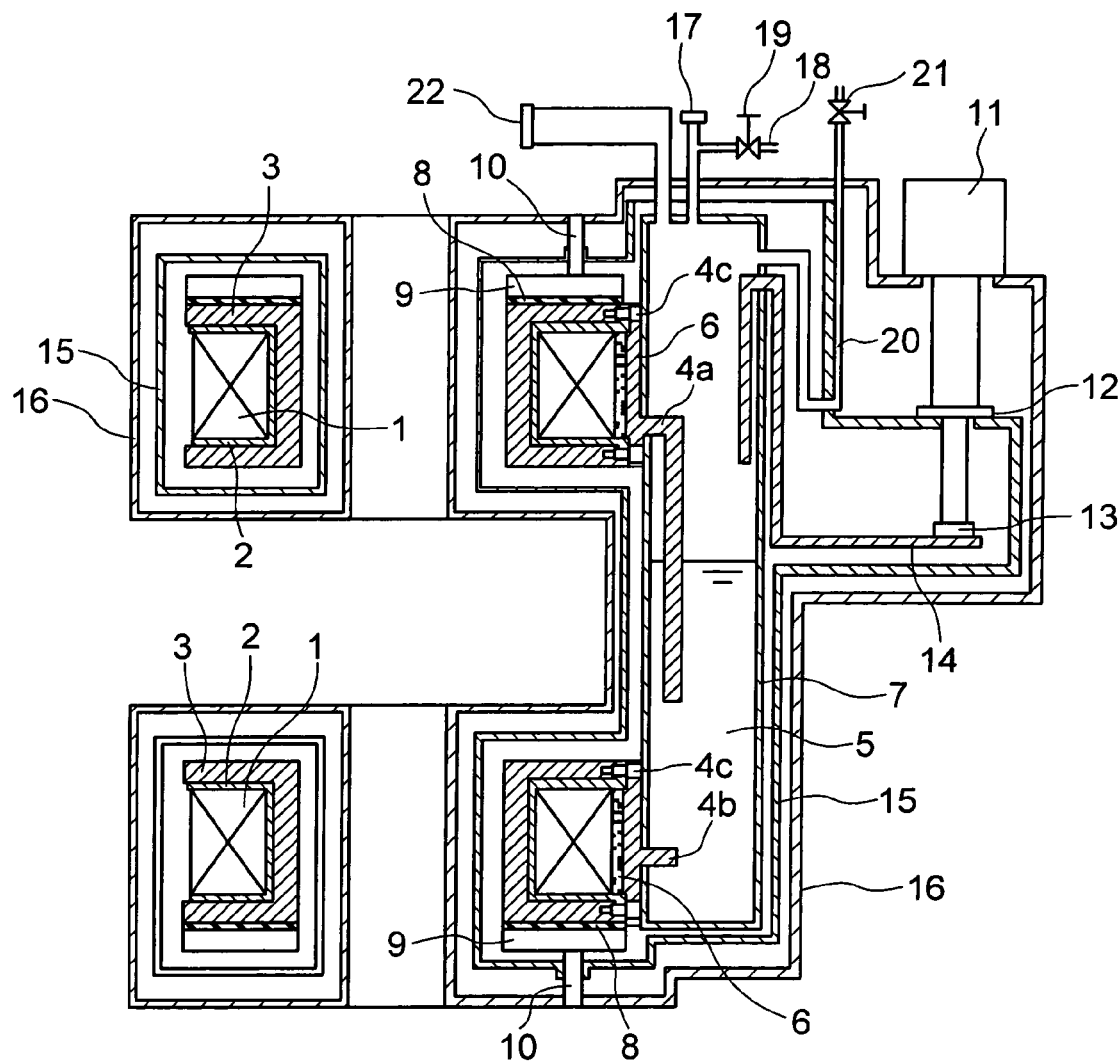
FIG. 2 is a cross-sectional view of the superconducting MRI magnet shown in FIG. 1.

FIG. 1 is an overall external view showing an example of a conduction cooling type superconducting MRI magnet according to the invention. FIG. 2 shows a cross section of the superconducting MRI magnet of FIG. 1.

As shown in FIG. 1, the superconducting MRI magnet according to the invention has two doughnut-shaped vacuum containers 16, each accommodating a superconducting coil, arranged in such a manner as to face each other vertically. A square column-shaped vacuum container 16 connecting the two doughnut-shaped vacuum containers 16 has a liquid helium receiver installed therein. A refrigerator 11 is mounted on the square column-shaped vacuum container 16.

Referring to the cross section of FIG. 2, the superconducting coils 1 of the superconducting magnet are wound on coil conduction members 2. The coil conduction members 2 are fitted in coil frames 3. Stresses generated as the coils are wound and due to an electromagnetic force produced by the superconducting coils are borne by the rigidity of the coil frames 3. Therefore, stainless steel having high rigidity is suitable for the material of the coil frames 3. If the electromagnetic force is smaller than the material strength, a copper alloy such as brass or an aluminum alloy such as duralumin, both having high thermal conductivity, are preferable. A metal with high thermal conductivity, such as copper, copper alloy, aluminum and aluminum alloy is suited for the material of the coil conduction members 2. Although the coil conduction members 2 has a thickness of 5 mm in this example, the thickness of the coil conduction members 2 should be set as large as circumstances allow.

Figure 3:
FIG. 3 is a front view of a coil conduction member.
Figure 4:
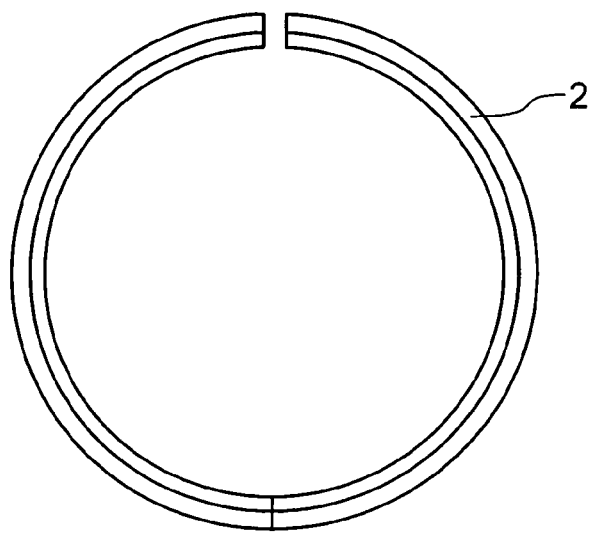
FIG. 4 is a plan view of the coil conduction member.

FIG. 3 and FIG. 4 are explanatory views of the coil conduction member 2, wherein FIG. 3 is a front view and FIG. 4 a plan view. The coil conduction members 2 are disposed inside the coil frames 3, and the superconducting coils 1 are wound around the coil conduction members 2 whose thermal conductivity is higher than that of the coil frames 3. In installing the coil conduction members 2 in the coil frames 3, the ring shaped coil conduction members 2 are each divided in halves and fitted in the coil frames 3, as shown in FIG. 3 and FIG. 4. Alternatively, the coil conduction members 2 may be each divided in three or more pieces to be installed in the coil frames 3.

Returning to FIG. 2, the superconducting magnet of the invention has thermal anchors 4a, 4b to transfer heat of the superconducting coils to liquid helium 5. Both the thermal anchors 4a, 4b are made of copper or aluminum having high thermal conductivity and secured to the coil conduction members 2 with bolts 4c.

Highly heat-conductive planar members 6 are installed between a part of the surfaces of the superconducting coils 1 and the thermal anchors 4a, 4b and serves for transferring heat of the superconducting coils 1 to the thermal anchors 4a, 4b. The highly heat-conductive planar members 6 are preferably formed of a material with high thermal conductivity. The thermal anchors 4a, 4b are bolted to the coil frames 3 of the superconducting coils 1, and highly thermally conductive indium or the like having excellent elasticity is suited for the material of the highly heat-conductive planar members 6 so that the superconducting coils 1 and the thermal anchors 4a, 4b are brought into intimate contact with each other when the thermal anchors 4a, 4b are fastened with bolts.

The liquid helium 5 is contained in the liquid receiver 7. Thermal insulators 8 are preferably formed of FRP which has low thermal conductivity and high strength. Stainless steel having small thermal conductivity at a helium temperature may be used to this end. Reinforcement members 9 are formed of stainless steel. For heat insulating load supports 10, carbon FRP, alumina FR or glass FRP having high strength and a high insulating capability is suited. As apparent from the external view of FIG. 1, the liquid receiver 7 is not provided over the entire peripheries of the superconducting coils 1 but is connected with a part of the superconducting coils. As described above, the superconducting magnet for MRI of the invention features the partial installation of the liquid receiver 7 similarly to an immersion cooling type superconducting magnet although it is actually of a conduction cooling type.

The refrigerator 11 comprises a small two-stage helium refrigerator. Denoted 12 is a first stage of the refrigerator 11 and 13 a second stage. As for the cooling performance the refrigerator 11 preferably has a capacity of 60 W when a temperature of the first stage 12 is 60 K and 1 W or higher when a temperature of the second stage 13 is 4 K. A heat exchanger 14 is thermally coupled with the second stage 13 of the refrigerator 11. The heat exchanger 14 in the liquid receiver 7 can condense evaporated helium gas into liquid. The heat exchanger 14 in the liquid receiver 7 can also cool liquid helium by natural convection when the end of the heat exchanger 14 is immersed in the liquid helium 5.

The first stage 12 of the refrigerator 11 is thermally coupled to a thermal shield 15. The thermal shield 15 blocks heat radiated from a room-temperature wall surface of the vacuum container 16, and the superconducting coils 1, coil frames 3, liquid receiver 7, thermal insulators 8 and reinforcement members 9 installed inside the thermal shield 15 are not subjected to heat radiated from the wall surface of the vacuum container 16. Further, for shielding the radiated heat, a laminated heat insulating material may be formed on an outer surface of the thermal shield 15. The laminated heat insulating material comprises deposited films stacked in layers, each consisting of a plastic film deposited with evaporated aluminum.

In an upper part of the liquid receiver 7, a liquid inlet port 17 for use in supplying liquid helium and a discharge port 18 for discharging helium gas are provided. On the discharge port 18 is installed a valve 19 that can be opened and closed manually. The valve 19 is used to open when liquid helium is supplied and to thereafter close. A cooling piping 20 communicates with the upper part of the liquid receiver 7 and is thermally coupled with the thermal shield 15. The cooling piping 20 in the atmosphere is provided with a check valve 21. The check valve 21 is closed, in the case where the refrigerator 11 is running at high enough cooling performance and the temperature of liquid helium 5 in the liquid receiver 7 falls below 4.2 K, when the pressure in the liquid receiver 7 is negative. The check valve 21 is opened when the refrigerator 11 stops and heat ingress into the liquid helium increases helium vapor resulting in the pressure in the liquid receiver 7 rising above a set pressure. This open-close operation of the check valve is automatically performed. When the refrigerator 11 stops and the pressure in the liquid receiver 7 rises, the check valve 21 is open, allowing cool helium gas to flow into the cooling piping 20. As a result, the thermal shield is cooled by the helium vapor, and its temperature rise can be prevented. A break plate 22 is provided in communication with the upper part of the liquid receiver 7. The break plate 22 is broken if the superconducting coils are quenched to generate a large volume of helium vapor instantaneously and the inner pressure in the liquid receiver 7 rises abnormally. The breakage of the break plate 22 protects the liquid receiver 7 from being destroyed. This break plate 22 is also broken when the check valve 21 fails to operate normally, and the inner pressure in the liquid receiver 7 rises abnormally.

The superconducting coils 1 shown in FIG. 2 are cooled, not though direct contact with the liquid helium 5, by transferring the heat of the superconducting coils 1 through the highly heat-conductive planar members 6 and the thermal anchors 4a, 4b to the liquid helium 5 and by allowing the liquid helium to boil in the thermal anchors 4a, 4b. As described above, the liquid tank 7 is not provided over the entire peripheries of the superconducting coils 1 but is connected to only a part of the superconducting coils 1. Thus, the thermal anchors 4a, 4b for transferring the heat of the superconducting coils 1 are provided only where there is the liquid receiver 7.

Figure 5:
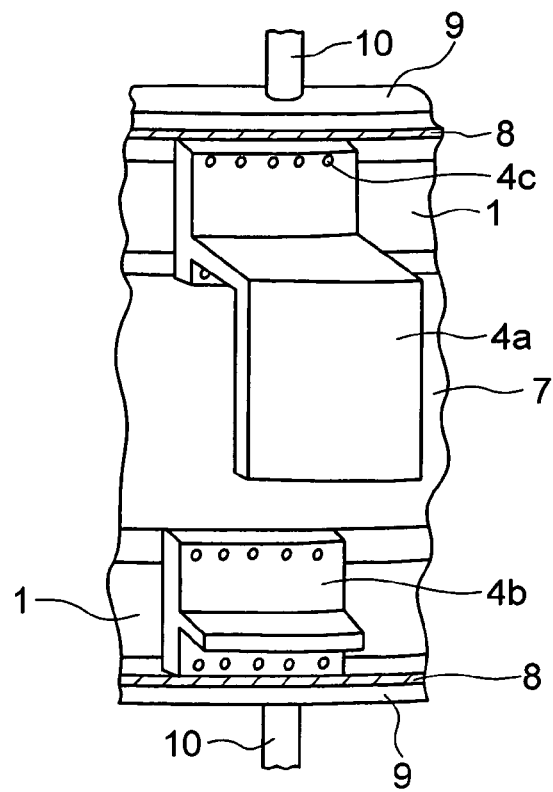
FIG. 5 is a perspective view of thermal anchors and their vicinity.

FIG. 5 is a perspective view of a portion where the thermal anchors 4a, 4b are installed. FIG. 5 illustrates the portion in which the liquid receiver 7 is removed. As shown in the figure, the thermal anchors 4a, 4b are mounted on only a part of the outer peripheries of the superconducting coils 1.

When heat is generated in the superconducting coils 1 remote from the liquid receiver 7, the heat is conducted to the coil conduction members 2 on the outer peripheries of the superconducting coils 1 and then transferred through the thermal anchors 4a, 4b to the liquid helium 5. This construction has the same cooling effect as the immersion cooling system in which the superconducting coils 1 are directly in contact with and cooled by the coolant. With this, in the superconducting MRI magnet, the cooling structure is simplified, the manufacturing cost and weight of the superconducting magnet are reduced, and the superconducting magnet is not quenched even if the refrigerator is stopped and the magnet is left as is for at least one day.

If the refrigerator 11 is stopped, the first stage 12 and second stage 13 of the refrigerator 11 rise in temperature. This causes the temperatures of the thermal shield 15 connected with the first stage 12 to rise. The heat exchanger 14 in the liquid receiver 7 also rises in temperature. Hence, when the heat exchanger 14 is in direct contact with the liquid helium 5, the amount of heat transferred to the liquid helium 5 increases, the inner pressure in the liquid receiver 7 is increased by the evaporated helium, the check valve 21 is open at a set inner pressure, and the helium gas flows into the cooling piping 20. This helium gas is low in temperature and cools the thermal shield 15. By lowering the temperature of the thermal shield 15, the amount of heat radiated to the liquid receiver 7, the superconducting coils 1 and so on inside the thermal shield 15 as well as the amount of heat conducted to the load supports 10 is reduced.

When the heat exchanger 14 is not in contact with liquid helium 5 while the refrigerator 11 is stopped, the gas and the heat exchanger 14 in the liquid receiver 7 exchange heat through natural convection. Although the amount of heat exchanged is smaller than when the heat exchanger 14 is in direct contact with the liquid helium, this natural convection imparts heat to the liquid helium 5, and the liquid helium is evaporated. When the evaporated helium in the liquid receiver 7 reaches the set inner pressure, the check valve 21 is opened, letting the helium gas flow through the cooling piping 20 to cool the thermal shield 15.

As described above, when the refrigerator 11 stops, the sensible heat of the evaporated helium cools the thermal shield 15, and it is possible to minimize the amount of liquid helium 5 evaporated.

When the refrigerator 11 is operating normally, the heat exchanger 14 is kept at about 4.2 K or lower. If the heat exchanger 14 is in contact with the liquid helium 5, the liquid helium 5 is cooled by natural convection. If the heat exchanger 14 and the liquid helium 5 are not in contact with each other, the heat exchanger 14 is in contact with helium gas above the liquid helium 5, and the gas condenses on the surface of the heat exchanger 14. If the amount of heat transferred to the liquid helium is smaller than the amount of heat removed by the second stage of the refrigerator 11, the inner pressure in the liquid receiver 7 becomes negative, and the check valve 21 is closed.

If the amount of heat entering the liquid helium 5 is larger than the amount of heat removed by the second stage of the refrigerator 11, the temperature of the liquid helium rises above 4.2 K, and the inner pressure in the liquid receiver 7 becomes positive (higher than the atmospheric pressure). When the inner pressure exceeds the set pressure of the check valve 21, the check valve 21 is opened, and the helium gas in the liquid receiver 7 flows out into the atmosphere. Under this condition, the level of the liquid helium 5 continues to decrease with time. The thermal anchor 4a is formed long enough to remain in contact with the liquid helium 5 even when the liquid level lowers.

When the refrigerator 11 stops, the amount of evaporated liquid helium increases and a rate at which the level of the liquid helium goes down also increases. For the superconducting coils 1 to maintain a thermally stable state without being quenched for a predetermined period of time, design techniques may be used which include increasing the volume of the liquid receiver 7 and reducing the amount of heat entering the liquid helium 5. Increasing the volume of the liquid receiver 7, however, possess a defect that an increase in an installation area of the superconducting magnet results and only a limited number of hospitals can afford to use it. The method of reducing the amount of heat entering the liquid helium depends on future technological advances such as upgrading of the refrigerator performance.

In contrast, according to the invention, by extending the thermal anchor 4a down to the bottom of the liquid receiver 7 and by thermally connecting it to the upper superconducting coil 1, the upper superconducting coil 1 can be kept at the liquid helium temperature even when the level of the liquid helium 5 falls below the position of the upper superconducting coil 1. Thus, it is possible to provide the superconducting magnet for MRI which is thermally stable without suffering from quenching of the superconducting coils 1. As described above, the invention can avoid the quenching of the superconducting coils by using a practical means even when the refrigerator 11 stops and the level of the liquid helium lowers, as long as the thermal anchors 4 remain in contact with the liquid helium 5. Therefore, the amount of the liquid helium can be reduced, and the volume of the liquid receiver can be made compact. This brings about an effect of reducing the manufacturing cost.

The superconducting MRI magnet shown in FIG. 2 uses the conduction cooling type superconducting coils 1 that are not in direct contact with the liquid helium. The superconducting coils 1 are formed by winding, on the coil conduction members 2 of high thermal conductivity, a wire formed of a niobium-titanium superconductor filament and a copper covering surrounding the filament. The superconducting coils further have an epoxy resin between the wires. The thermal conductivity of the superconducting coils varies according to a direction. The thermal conductivity at a temperature of 4.2 K in a direction of winding and that in a direction perpendicular to the winding are about 200 W/mK and about 0.3 W/mK respectively. In other words, heat is not easily conducted in a direction perpendicular to the superconducting coil winding but is easily conducted in a direction of winding of the superconducting coil.

The basic idea behind this invention utilizes this characteristic. As for cooling of the superconducting coils 1 made up of windings, if a part of the superconducting coils 1 can be cooled to a liquid helium temperature, it is possible to cool the whole superconducting coils 1 to the liquid helium temperature owing to the thermal conductivity in the direction of coil winding. In view of this, to keep a part of the superconducting coils at the liquid helium temperature, the thermal anchors 4a, 4b in contact with the liquid helium 5 are put in contact with the highly heat-conductive planar members 6. Further, the highly heat-conductive planar members 6 are put in contact with a part of the superconducting coils. The highly heat-conductive planar members 6 have a function of thermally coupling the thermal anchors 4a, 4b with a part of the superconducting coils. Thus, indium which has high contact thermal conductance is suited for the material. Other materials such as grease and polymers, as long as they have high thermal conductivity and secure a sufficient contact area, can also be used for the material of the highly heat-conductive planar members 6.

Figure 6:
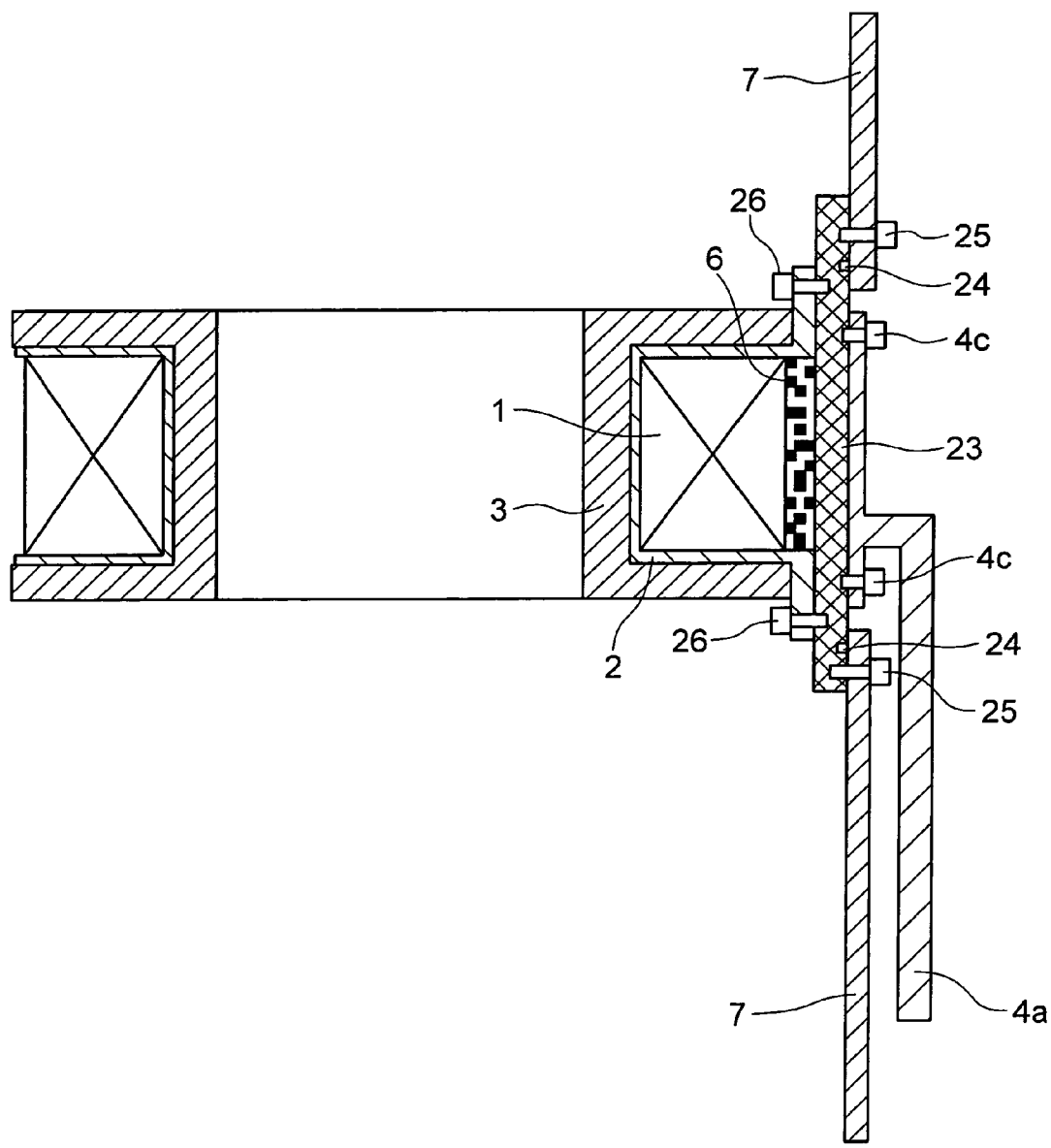
FIG. 6 is a cross-sectional view of the neighborhood of a thermal anchor.

FIG. 6 is a schematic cross-sectional view showing another example of thermal anchors and the construction of their neighborhood. The liquid receiver 7 is placed in the vacuum container 16 and needs to be hermetically sealed. In this example, a method of thermally coupling the thermal anchor 4a with the superconducting coil 1 and installing it in the liquid tank 7 will be explained.

A copper plate 23 is interposed between the thermal anchor 4a and the highly heat-conductive planar member 6. The copper plate 23 serves for transferring heat of the superconducting coil 1 to the thermal anchor 4a efficiently. Thus, the copper plate 23 is made of copper. The copper plate 23 is fitted with packings 24 at its upper and lower parts. The packings 24 are made of indium. The indium packings 24 are fastened between the copper plate 23 and the liquid receiver 7 by bolts 25 to be deformed along the surfaces they contact. This deformation of the packings 24 brings the liquid receiver 7 and the copper plate 23 into intimate contact with each other, and the liquid receiver 7 is kept in a hermetically sealed state. The coil conduction member 2 and the copper plate 23 are fastened together by bolts 26. The heat of the superconducting coil 1 is transferred through the highly heat-conductive planar member 6 and the copper plate 23, or through the coil conduction member 2 and the copper plate 23, to the thermal anchor 4a. As described above, the thermal anchor 4a mounted on the liquid receiver 7 can transport heat from the superconducting coil 1, while maintaining the liquid tightness of the liquid receiver 7.

Figure 7:
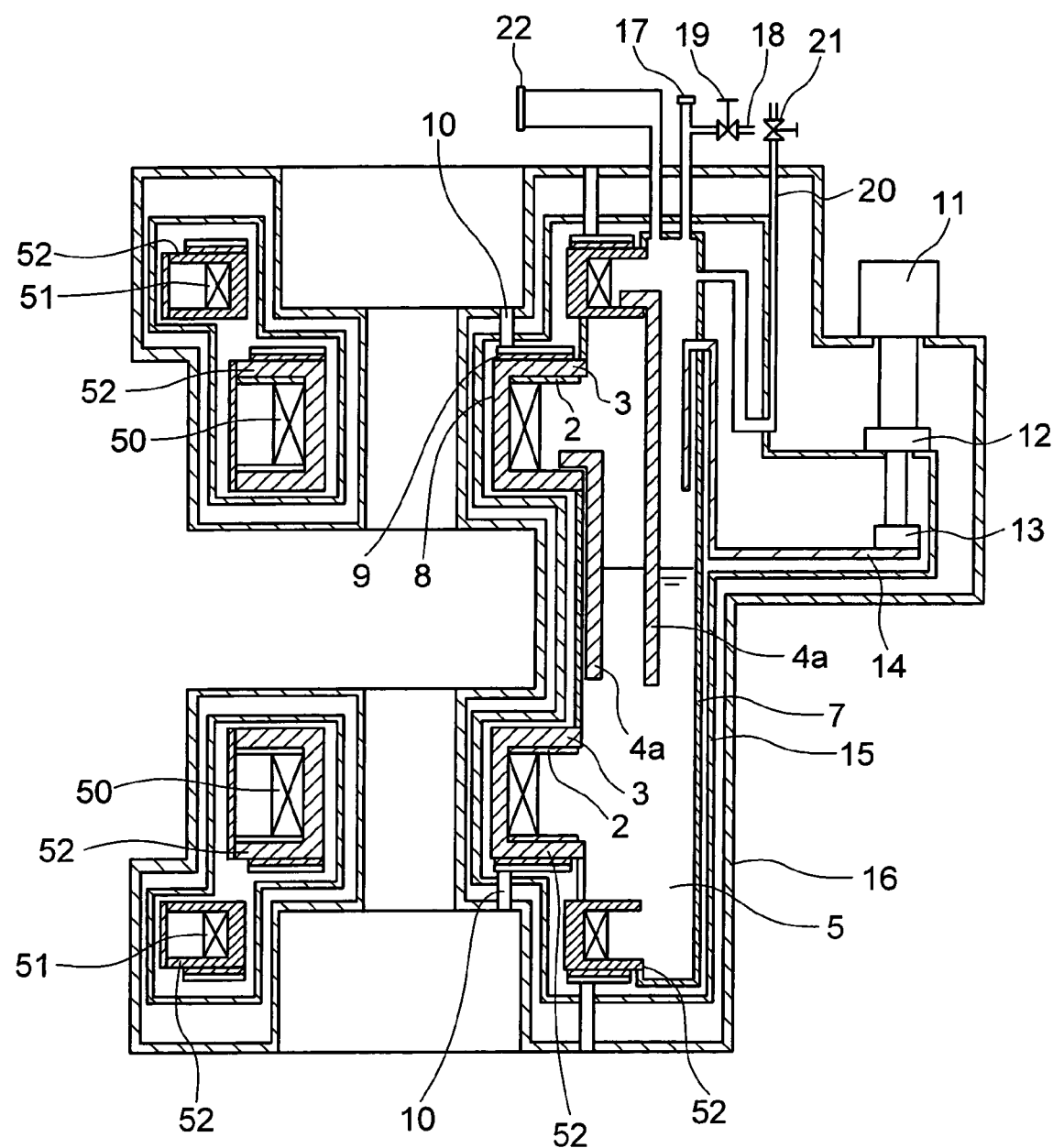
FIG. 7 is a cross-sectional view of an immersion cooling type superconducting MRI magnet.

FIG. 7 illustrates an example in which the invention is applied to a superconducting MRI magnet using the immersion cooling type superconducting magnet. As for superconducting coils, two sets of a main superconducting coil 50 and an auxiliary superconducting coil 51 are mounted on an upper and a lower part, respectively. The main superconducting coil 50 generates a predetermined magnetic field, and the auxiliary superconducting coil 51 serves for adjusting a uniformity of the field and for restraining the magnetic field escaping from the superconducting magnet to the outside.

The main superconducting coil 50 and the auxiliary superconducting coil 51 are installed in helium tanks 52 each containing liquid helium 5. The helium tanks 52 form a part of the liquid receiver 7. When the level of the liquid helium rises above the height of the superconducting coil, the liquid helium flows into the helium tanks 52. Coil conduction members 2 are disposed between the main superconducting coil 50 and the auxiliary superconducting coil 51 and the respective helium tanks 52. The coil conduction members 2 are in a shape divided in halves, as shown in FIG. 3 and FIG. 4. When the superconducting wire is to be wound, winding is carried out in a state that the coil conduction members 2 have been installed on the coil frames 3.

Thermal anchors 4a are connected with the coil conduction members 2. With the thermal anchors 4a being in contact with liquid helium 5, the heat of the main superconducting coil 50 and the auxiliary superconducting coil 51 is transferred through the coil conduction members 2 and the thermal anchors 4a to the liquid helium 5. As long as the thermal anchors 4a are in contact with the liquid helium 5, the main superconducting coil 50 and the auxiliary superconducting coil 51 are cooled. The longer the thermal anchors 4a are formed, the smaller the liquid helium volume of the liquid receiver 7 is made, since the superconducting coils themselves are stably cooled as long as the thermal anchors are in contact with the liquid helium 5 even when the level of the liquid helium 5 is lower than the main superconducting coil 50 and the auxiliary superconducting coil 51. This means that the compact superconducting magnet can be provided. Further, the reduced volume of the liquid receiver 7 leads to reductions in material cost and superconducting magnet transport cost.

As described above, also in the immersion cooling type superconducting MRI magnet, by installing the thermal anchors 4a, operation can be carried out while avoiding quenching of the superconducting magnet for a predetermined period of time even when the refrigerator 11 stops, as in the case with the conduction cooling type superconducting MRI magnet shown in FIG. 2.

Figure 8:
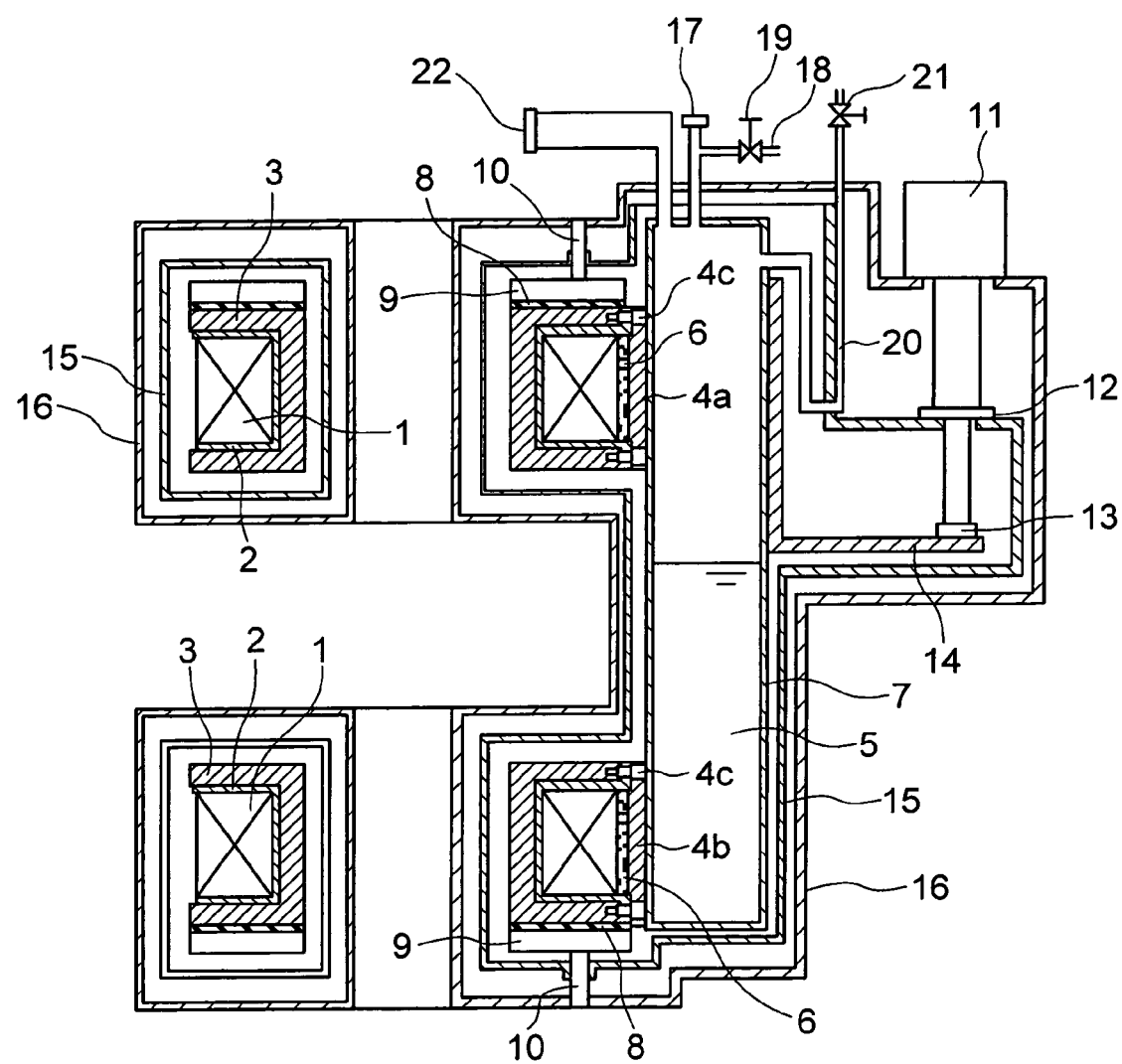
FIG. 8 is a cross-sectional view of the conduction cooling type superconducting MRI magnet according to another embodiment.

FIG. 8 is a cross-sectional view for explaining an example of a superconducting MRI magnet in which the material of the liquid receiver 7 of FIG. 1 is a material of high thermal conductivity, such as copper. By using the material of high thermal conductivity such as copper for the liquid receiver 7, a part of the thermal anchor 4a and the heat exchanger 14 in the liquid receiver 7 of FIG. 2 becomes unnecessary.

Instead, end portions of the remainder of the heat exchanger 14 and the thermal anchor 4a are thermally connected with the liquid receiver 7. By forming the liquid receiver 7 of a highly heat-conductive material, the thermal anchor 4a and the heat exchanger 14 can be made short, and an effect of reducing the material cost is brought about.

The superconducting magnets shown in FIG. 2 and FIG. 8 are of the conduction cooling type in which the superconducting coils are not immersed in the liquid helium 5. Also in the immersion cooling type superconducting magnet shown in FIG. 7, the thermal anchors 4a and the heat exchanger 14 can be made short by forming the liquid receiver 7 of a highly heat-conductive material such as copper.

Figure 9:
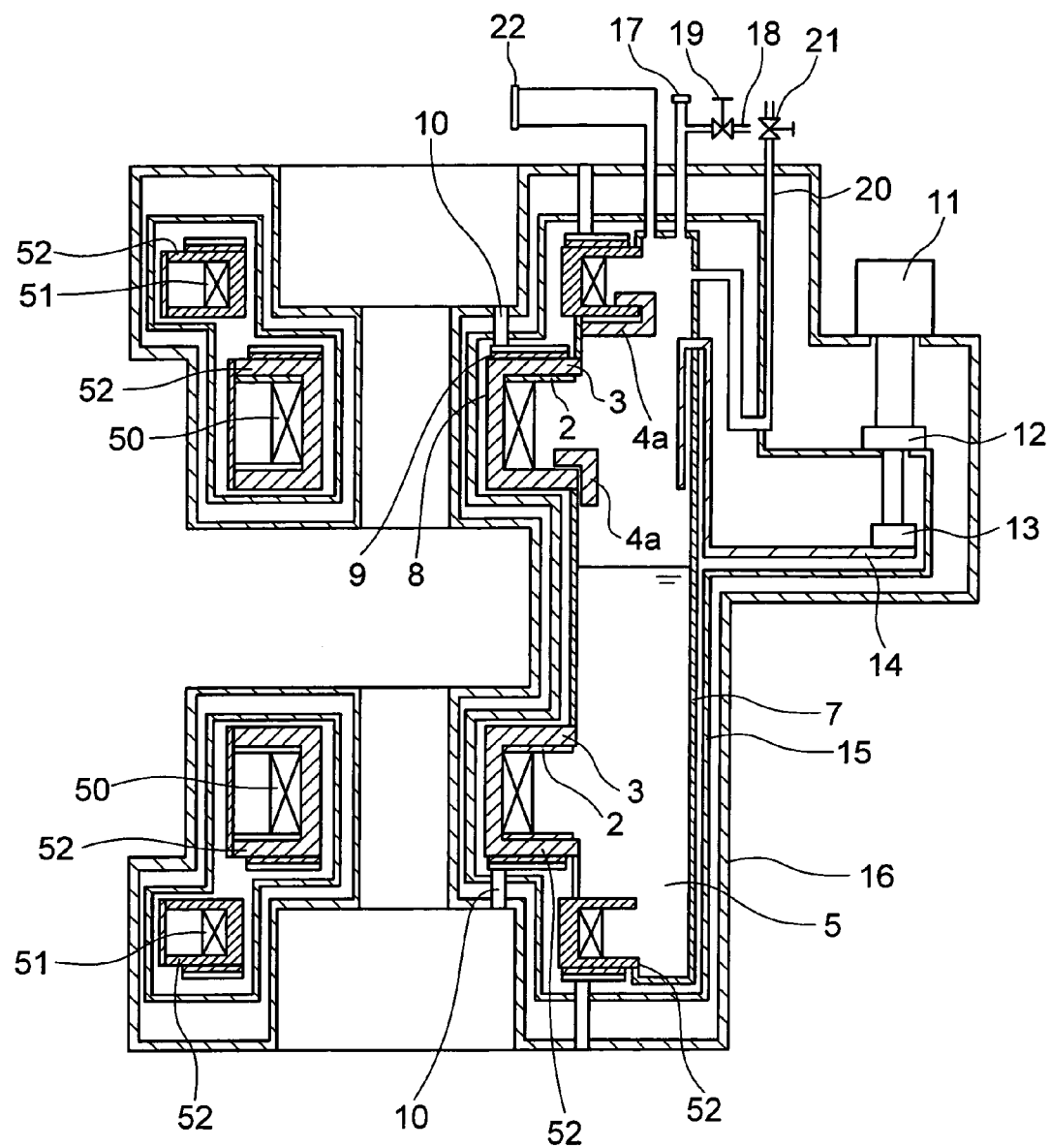
FIG. 9 is a cross-sectional view of the immersion cooling type superconducting MRI magnet according to still another embodiment.

FIG. 9 shows an immersion cooling type superconducting magnet in which the material of the liquid receiver 7 for the liquid helium 5 is a highly heat-conductive material. An end portion of the heat exchanger 14, which is connected to the second stage 13 of the refrigerator 11, is thermally connected to the outer periphery of the highly conductive liquid receiver 7, and end portions of the thermal anchors 4a, which are thermally connected to the coil conduction members 2, are thermally connected to nearby portions of the liquid receiver 7. With this construction, the thermal anchors 4a and the heat exchanger 14 are made short. The liquid receiver 7 is kept at the liquid helium temperature even if the level of the liquid helium 5 lowers, and therefore there is no heat problem that would otherwise occur when the thermal anchors 4a and the heat exchanger 14 become short.

As described above, by forming the liquid receiver 7 in the conduction cooling type or immersion cooling type superconducting MRI magnet of a highly heat-conductive material, the material cost and therefore the manufacturing cost can be reduced.

It should be understood by those skilled in the art that although the foregoing description has been made on the embodiments of the invention, the invention is not limited solely thereto and various changes and modifications may be made without departing from the spirit of the invention and the scope of the appended claims.

What is claimed is:

1. A superconducting magnet for MRI, comprising:
    upper and lower coil assemblies arranged to generate a vertical magnetic field in a space between the coil assemblies, each of said coil assemblies including a doughnut-shaped superconducting coil, a coil frame on which said superconducting coil is wound, and a coil conduction member of a highly heat-conductive material interposed between said superconducting coil and said coil frame;
    a liquid receiver storing liquid helium;
    a thermal shield accommodating said upper and lower coil assemblies and said liquid receiver;
    a vacuum container accommodating said thermal shield;
    a refrigerator for cooling said liquid receiver and said thermal shield; and
    a thermal anchor provided in said liquid receiver, said thermal anchor being formed of a highly heat-conductive material and thermally connected to said coil conduction member of at least the upper coil assembly.

2. The magnet according to claim 1, wherein said coil conduction members are divided in two or more in their circumferential directions.

3. The magnet according to claim 1, wherein said liquid receiver is provided on a circumferentially partial area of the upper and lower coil assemblies.

4. The magnet according to claim 1, further comprising a highly heat-conductive planar member of a highly heat-conductive material installed on a part of the superconducting coil of at least the upper coil assembly, wherein said thermal anchor is thermally connected with said highly heat-conductive planar member.

5. The magnet according to claim 4, wherein a part of a wall forming said liquid receiver is formed of a plate of a highly heat-conductive material, and said thermal anchor is thermally connected with the highly heat-conductive planar member through said plate.

6. The magnet according to claim 5, wherein said plate is installed on the liquid receiver through a packing of indium.

7. The magnet according to claim 4, further comprising a heat exchanger connected to said refrigerator, wherein said liquid receiver is formed of a highly heat-conductive material and is thermally connected to said heat exchanger and to one of said highly heat-conductive planar member and said thermal anchor.

8. The magnet according to claim 1, wherein said coil frames form a part of the wall of the liquid receiver.

9. The magnet according to claim 1, wherein said upper and lower coil assemblies are installed in a helium tank communicating with the liquid receiver.

10. The magnet according to claim 1, wherein said the thermal anchor extends in a direction in which a level of liquid helium in the liquid receiver changes.

11. The magnet according to claim 1, wherein said coil frames of the coil assemblies are formed of a highly heat-conductive material comprising copper alloy or aluminum alloy.

* * * * *